(12) United States Patent
Fuyuki et al.

(10) Patent No.: US 10,790,401 B2
(45) Date of Patent: Sep. 29, 2020

(54) SEMICONDUCTOR STACKED BODY AND LIGHT-RECEIVING DEVICE

(71) Applicant: SUMITOMO ELECTRIC INDUSTRIES, LTD., Osaka-shi, Osaka (JP)

(72) Inventors: Takuma Fuyuki, Osaka (JP); Takashi Go, Osaka (JP); Takashi Ishizuka, Osaka (JP)

(73) Assignee: SUMITOMO ELECTRIC INDUSTRIES, LTD., Osaka-shi, Osaka (JP)

(*) Notice: Subject to any disclaimer, the term of this patent is extended or adjusted under 35 U.S.C. 154(b) by 0 days.

(21) Appl. No.: 16/407,521

(22) Filed: May 9, 2019

(65) Prior Publication Data
US 2019/0355857 A1 Nov. 21, 2019

(30) Foreign Application Priority Data
May 16, 2018 (JP) .................. 2018-094257

(51) Int. Cl.
*H01L 31/0304* (2006.01)
*H01L 31/0352* (2006.01)
(Continued)

(52) U.S. Cl.
CPC ........... *H01L 31/035272* (2013.01); *H01L 27/14601* (2013.01); *H01L 31/03046* (2013.01);
(Continued)

(58) Field of Classification Search
None
See application file for complete search history.

(56) References Cited

U.S. PATENT DOCUMENTS

2002/0053676 A1* 5/2002 Kozaki ................ B82Y 20/00
257/88

FOREIGN PATENT DOCUMENTS

JP 2016-92037 A 5/2016
JP 2017-135229 A 8/2017

OTHER PUBLICATIONS

Rubin Sidhu et al., "A Long-Wavelength Photodiode on InP Using Lattice-Matched GaInAs-GaAsSb Type-II Quantum Wells," IEEE Photonics Technology Letters, Dec. 2005, pp. 2715-2717, vol. 17, No. 12.

* cited by examiner

*Primary Examiner* — Cheung Lee
(74) *Attorney, Agent, or Firm* — Faegre Drinker Biddle & Reath LLP (57) ABSTRACT

A semiconductor stacked body includes a base layer containing a III-V group compound semiconductor, a light-receiving layer containing a III-V group compound semiconductor, a control layer containing a III-V group compound semiconductor and disposed in contact with the light-receiving layer, a diffusion blocking layer containing a III-V group compound semiconductor and a p-type impurity that generates a p-type carrier, the diffusion blocking layer having a p-type impurity concentration of $1 \times 10^{16}$ cm$^{-3}$ or less, and a contact layer containing a III-V group compound semiconductor and having p-type conductivity. These layers are stacked in this order. The concentration of an element in the control layer, the element being identical to a group V element contained in the light-receiving layer, is lower on a main surface of the control layer adjacent to the diffusion blocking layer than on a main surface of the control layer adjacent to the light-receiving layer.

12 Claims, 10 Drawing Sheets

(51) Int. Cl.
*H01L 31/109* (2006.01)
*H01L 31/18* (2006.01)
*H01L 27/146* (2006.01)
*H01L 31/12* (2006.01)

(52) U.S. Cl.
CPC .... *H01L 31/035236* (2013.01); *H01L 31/109* (2013.01); *H01L 31/12* (2013.01); *H01L 31/1844* (2013.01)

SEMICONDUCTOR STACKED BODY AND LIGHT-RECEIVING DEVICE

CROSS REFERENCES TO RELATED APPLICATIONS

The present application contains subject matter related to Japanese Patent Application No. 2018-094257 filed in the Japan Patent Office on May 16, 2018, the entire contents of which are incorporated herein by reference.

BACKGROUND

The present disclosure relates to a semiconductor stacked body and a light-receiving device.

Semiconductor stacked body containing III-V group compound semiconductors can be used for the production of light-receiving devices sensitive to light in the infrared region. Specifically, for example, a buffer layer, a light-receiving layer, and a contact layer that contain III-V group compound semiconductors are stacked in sequence on a substrate containing a group III-V compound semiconductor, and then appropriate electrodes are formed, thereby producing an infrared light-receiving device. Regarding such a light-receiving device, a photodiode having a cutoff wavelength of 2 µm to 5 µm is reported, for example, in a non-patent literature: R. Sidhu, et al., "A Long-Wavelength Photodiode on InP Using Lattice-Matched GaInAs—GaAsSb Type-II Quantum Wells", IEEE Photonics Technology Letters, Vol. 17, No. 12, December 2005, p. 2715-2717.

As a measure to improve the sensitivity of the light-receiving device, it is reported that a diffusion blocking layer having a low impurity concentration is disposed between a contact layer and a light-receiving layer in order to inhibit the diffusion of an impurity from the contact layer to the light-receiving layer. For example, such a structure is disclosed in Japanese Unexamined Patent Application Publication Nos. 2016-092037 and 2017-135229 disclose.

SUMMARY OF THE INVENTION

The present disclosure provides a semiconductor stacked body including a base layer containing a III-V group compound semiconductor and having n-type conductivity, a light-receiving layer containing a III-V group compound semiconductor, a control layer containing a III-V group compound semiconductor and disposed in contact with the light-receiving layer, a diffusion blocking layer containing a III-V group compound semiconductor and a p-type impurity that generates a p-type carrier, the diffusion blocking layer having a p-type impurity concentration of $1\times10^{16}$ cm$^{-3}$ or less, and a contact layer containing a III-V group compound semiconductor and having p-type conductivity. The base layer, the light-receiving layer, the control layer, the diffusion blocking layer, and the contact layer are stacked in this order. The concentration of an element in the control layer, the element being identical to a group V element contained in the light-receiving layer, is lower on a main surface of the control layer adjacent to the diffusion blocking layer than on a main surface of the control layer adjacent to the light-receiving layer.

DESCRIPTION OF THE EMBODIMENTS

In the case where a diffusion blocking layer is used, carriers (electrons) are accumulated at the interface between the diffusion blocking layer and a light-receiving layer. The accumulation of the carriers inhibits the extension of a depletion layer, thereby causing a problem of a decrease in the sensitivity of a light-receiving device. To deal with this problem, Japanese Unexamined Patent Application Publication No. 2017-135229 discloses that an impurity (p-type impurity) that forms carriers (holes) having a conductivity type different from the carriers accumulated is incorporated in a region where the carriers are accumulated, to compensate for the carriers accumulated. To appropriately compensate for the carriers accumulated, it is necessary to accurately control the amount and distribution of the impurity incorporated. However, the accurate control of the amount and distribution of the impurity incorporated is not easy, thus disadvantageously decreasing the yield in the production of the light-receiving device. Accordingly, it is an object of the present disclosure to provide a semiconductor stacked body and a light-receiving device that can be easily produced, the semiconductor stacked body being capable of improving the sensitivity of the light-receiving device including a semiconductor layer containing a III-V group compound semiconductor.

First, embodiments of the present disclosure will be listed and explained. The semiconductor stacked body of the present disclosure includes a base layer containing a III-V group compound semiconductor and having n-type conductivity, a light-receiving layer containing a III-V group compound semiconductor, a control layer containing a III-V group compound semiconductor and disposed in contact with the light-receiving layer, a diffusion blocking layer containing a III-V group compound semiconductor and a p-type impurity that generates a p-type carrier, the diffusion blocking layer having a p-type impurity concentration of $1×10^{16}$ cm$^{-3}$ or less, and a contact layer containing a III-V group compound semiconductor and having p-type conductivity. The base layer, the light-receiving layer, the control layer, the diffusion blocking layer, and the contact layer are stacked in this order. The concentration of an element in the control layer, the element being identical to a group V element contained in the light-receiving layer, is lower on a main surface of the control layer adjacent to the diffusion blocking layer than on a main surface of the control layer adjacent to the light-receiving layer.

As described above, in the case of a structure in which the incorporation of a p-type impurity compensates for electrons serving as carriers accumulated at the interface between a diffusion blocking layer and a light-receiving layer, it is difficult to accurately control the amount and distribution of a p-type impurity incorporated, thus disadvantageously resulting in a low yield of a light-receiving device produced from the semiconductor stacked body. Here, the accumulation of the electrons is caused by a sharp change in conduction band level between the diffusion blocking layer and the light-receiving layer. The inventors have found a measure to reduce the accumulation of carriers (electrons) by disposing a control layer that reduces the sharp change in conduction band level, instead of the impurity incorporation that compensates for electrons accumulated.

In the semiconductor stacked body of the present disclosure, specifically, the control layer is disposed between the light-receiving layer and the diffusion blocking layer and in contact with the light-receiving layer, and the concentration of the element in the control layer, the element being identical to a group V element contained in the light-receiving layer, is lower on a main surface of the control layer adjacent to the diffusion blocking layer than on a main surface of the control layer adjacent to the light-receiving layer. The presence of the control layer reduces a sharp change in conduction band level between the diffusion blocking layer and the light-receiving layer to reduce the accumulation of the carriers. This reduces a phenomenon in which the extension of a depletion layer is inhibited by the accumulation of the carriers, thus improving the sensitivity of a light-receiving device. The use of the structure eliminates the need for the accurate control of the amount and distribution of the p-type impurity that is incorporated to compensate for the electrons that are the carriers accumulated. According to the semiconductor stacked body of the present disclosure, it is possible to provide the semiconductor stacked body that can be easily produced and that can improve the sensitivity of a light-receiving device including a semiconductor layer containing a III-V group compound semiconductor.

In the control layer of the semiconductor stacked body, the concentration of the element in the control layer, the element being identical to the group V element contained in the light-receiving layer, may decrease with decreasing distance from the main surface of the control layer adjacent to the light-receiving layer toward the main surface of the control layer adjacent to the diffusion blocking layer. This facilitates the reduction of the accumulation of the carriers.

In the control layer of the semiconductor stacked body, the concentration of the element in the control layer, the element being identical to the group V element contained in the light-receiving layer, may decrease monotonically with decreasing distance from the main surface of the control layer adjacent to the light-receiving layer toward the main surface of the control layer adjacent to the diffusion blocking layer. This further facilitates the reduction of the accumulation of the carriers.

In the control layer of the semiconductor stacked body, the concentration of the element in the control layer, the element being identical to the group V element contained in the light-receiving layer, may decrease stepwise with decreasing distance from the main surface of the control layer adjacent to the light-receiving layer toward the main surface of the control layer adjacent to the diffusion blocking layer. In this case, a structure in which the concentration of the group V element decreases with decreasing distance from the main surface of the control layer adjacent to the light-receiving layer toward the main surface of the control layer adjacent to the diffusion blocking layer can be easily produced.

In the semiconductor stacked body, the group V element contained in the light-receiving layer may be Sb (antimony). Sb is suitable as the group V element of the III-V group compound semiconductor contained in the light-receiving layer. The accumulation of the carriers can be reduced by using the light-receiving layer that contains Sb and disposing the control layer having a lower Sb concentration on the main surface of the control layer adjacent to the diffusion blocking layer than on the main surface of the control layer adjacent to the light-receiving layer.

In the semiconductor stacked body, the control layer may have a thickness of 2 nm or more. In this case, the function of the control layer can be more reliably achieved. The control layer preferably has a thickness of 5 nm or more. Additionally, the control layer preferably has a thickness of 500 nm or less, more preferably 100 nm or less.

In the semiconductor stacked body, the diffusion blocking layer may have a thickness of 50 nm or more. In this case, the use of the diffusion blocking layer having such a sufficient thickness enables a more reliable reduction of the diffusion of the impurity from the contact layer to the light-receiving layer. Additionally, the use of the diffusion blocking layer having a sufficient thickness facilitates the accumulation of the carriers; hence, the effect of the control layer is more noticeable. The diffusion blocking layer preferably has a thickness of 500 nm or more. The diffusion blocking layer preferably has a thickness of 2,000 nm or less, more preferably 1,000 nm or less.

In the semiconductor stacked body, the light-receiving layer may have a multi-quantum-well structure including a pair of an $In_xGa_{1-x}As$ (indium gallium arsenide, where x is 0.38 or more and 1 or less) layer and a $GaAs_{1-y}Sb_y$ (gallium arsenide antimonide, where y is 0.36 or more and 1 or less) layer, or a pair of a $Ga_{1-u}In_uN_vAs_{1-v}$ (gallium indium nitride arsenide, where u is 0.4 or more and 0.8 or less, and v is more than 0 and 0.2 or less) layer and a $GaAs_{1-y}Sb_y$ (where y is 0.36 or more and 0.62 or less) layer. In this case, the light-receiving layer easily has a type-II quantum well structure appropriate for a light-receiving device sensitive to light in the near-infrared region to the mid-infrared region.

In the semiconductor stacked body, the base layer may include a substrate containing GaAs (gallium arsenide), GaP (gallium phosphide), GaSb (gallium antimonide), InP (indium phosphide), InAs (indium arsenide), InSb (indium antimonide), AlSb (aluminum antimonide), or AlAs (aluminum arsenide). This facilitates the use of the light-receiving layer appropriate for the detection of light in the near-infrared region to the mid-infrared region.

In the semiconductor stacked body, the control layer may be an $In_sGa_{1-s}As_tSb_{1-t}$ (indium gallium arsenide antimonide, where s is 0 or more and 1 or less, and t is 0 or more and 1 or less) layer. When the foregoing light-receiving layer is used, such a material is suitable as a material of the control layer.

In the semiconductor stacked body, the light-receiving layer may have a thickness of 1 μm or more. This facilitates the production of a light-receiving device having good sensitivity from the semiconductor stacked body.

A light-receiving device according to an embodiment of the present disclosure includes the semiconductor stacked body and an electrode disposed on the semiconductor stacked body. The light-receiving device of the present disclosure includes the semiconductor stacked body of the present disclosure. Thus, the light-receiving device of the present disclosure is easily produced and has improved sensitivity.

DETAILS OF EMBODIMENTS OF PRESENT DISCLOSURE

A semiconductor stacked body according to embodiments of the present disclosure will be described below with reference to the attached drawings. In the drawings, the same or equivalent portions are designated using the same reference numerals, and descriptions are not redundantly repeated.

First Embodiment

Figure 1:
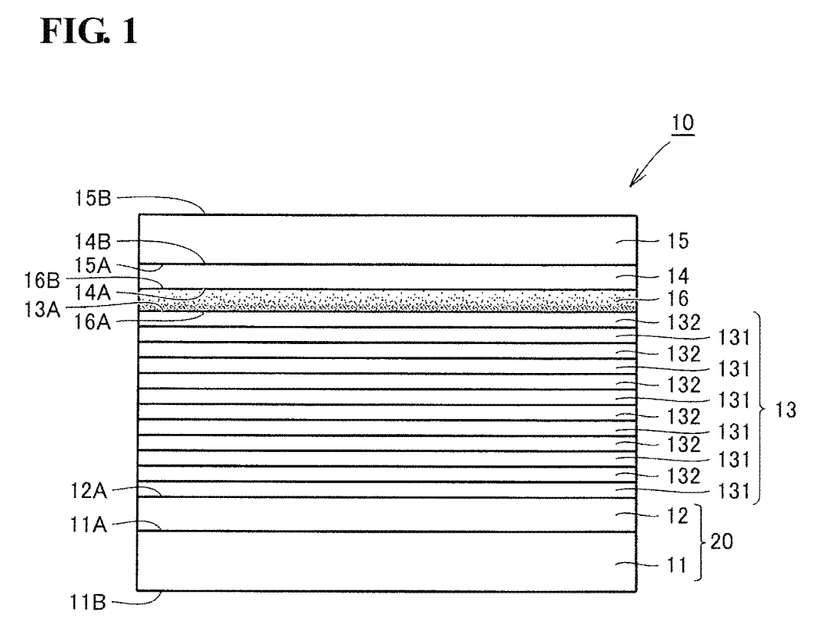
FIG. 1 is a schematic cross-sectional view illustrating the structure of a semiconductor stacked body according to a first embodiment.

As illustrated in FIG. 1, a semiconductor stacked body 10 according to a first embodiment includes a substrate 11, a buffer layer 12, a quantum-well light-receiving layer 13 serving as a light-receiving layer having a quantum-well structure, a control layer 16, a diffusion blocking layer 14, and a contact layer 15.

The substrate 11 contains a III-V group compound semiconductor. The substrate 11 has a diameter of 50 mm or more, for example, 3 inches. As the III-V group compound semiconductor contained in the substrate 11, for example, GaAs, GaP, GaSb, InP, InAs, InSb, AlSb, or AlAs may be used. The use of the substrate 11 containing the III-V group compound semiconductor provides the semiconductor stacked body 10 appropriate for the production of an infrared light-receiving device. The substrate 11 includes one main surface 11A and the other main surface 11B.

Specifically, for example, InP having n-type conductivity (n-InP) is used as a compound semiconductor contained in the substrate 11. As an example of an n-type impurity contained in the substrate 11, for example, S (sulfur) may be used. The substrate 11 may have a diameter of 80 mm or more (for example, 4 inches), even 100 mm or more (for example, 5 inches), even more 130 mm or more (for example, 6 inches) in order to improve the production efficiency and the yield of a semiconductor device (light-receiving device) including the semiconductor stacked body 10.

The buffer layer 12 is a semiconductor layer disposed in contact with the one main surface 11A of the substrate 11. The buffer layer 12 contains a III-V group compound semiconductor. As the III-V group compound semiconductor contained in the buffer layer 12, for example, a binary material such as GaSb, AlSb, or InSb, or a ternary material such as GaInSb (gallium indium antimonide), AlInSb (aluminum indium antimonide), AlGaSb (aluminum gallium antimonide), InGaAs (indium gallium arsenide), or GaAsSb (gallium arsenide antimonide) may be used. Specifically, for example, InGaAs having n-type conductivity (n-InGaAs) is used as a compound semiconductor contained in the buffer layer 12. As the n-type impurity contained in the buffer layer 12, for example, Si (silicon), S (sulfur), Se (selenium), Ge (germanium), Te (tellurium), or Sn (tin) may be used. The buffer layer 12 has a thickness of, for example, 100 nm or more and 200 nm or less. The substrate 11 and the buffer layer 12 are included in a base layer 20.

The quantum-well light-receiving layer 13 is disposed in contact with a first main surface 12A of the buffer layer 12 opposite the side of the buffer layer 12 facing the substrate 11. The quantum-well light-receiving layer 13 has a structure in which two element layers each containing a III-V group compound semiconductor are alternately stacked. Specifically, the quantum-well light-receiving layer 13 has a structure in which a first element layer 131 and a second element layer 132 are alternately stacked. In this embodiment, the material of the first element layer 131 is undoped $In_xGa_{1-x}As$ (where x is 0.38 or more and 1 or less). The material of the second element layer 132 is undoped $GaAs_{1-y}Sb_y$ (where y is 0.36 or more and 1 or less).

Materials of the first element layer 131 and the second element layer 132 are not limited to the foregoing materials. As a material of the first element layer 131, for example, undoped $Ga_{1-u}In_uN_vAs_{1-v}$ (where u is 0.4 or more and 0.8 or less, and v is more than 0 and 0.2 or less) may be used. As a material of the second element layer 132, for example, undoped $GaAs_{1-y}Sb_y$ (wherein y is 0.36 or more and 0.62 or less) may be used.

As described above, the use of the light-receiving layer having the multi-quantum-well structure including a pair of an $In_xGa_{1-x}As$ layer (where x is 0.38 or more and 1 or less) and a $GaAs_{1-y}Sb_y$ layer (where y is 0.36 or more and 1 or less), or a pair of a $Ga_{1-u}In_uN_vAs_{1-v}$ layer (where u is 0.4 or more and 0.8 or less, and v is more than 0 and 0.2 or less) and a $GaAs_{1-y}Sb_y$ layer (where y is 0.36 or more and 0.62 or less) can provide the semiconductor stacked body 10 that can be used for the production of a light-receiving device appropriate for the detection of light in the near-infrared region to the mid-infrared region. Each of the first element layer 131 and the second element layer 132 may have a thickness of, for example, 5 nm. The quantum-well light-receiving layer 13 may have a structure sin which, for example, 250 unit structures each including the first element layer 131 and the second element layer 132 are stacked. That is, the quantum-well structure 13 may have a thickness of, for example, 2.5 μm.

As a material of the first element layer 131, InAs may be used. As a material of the second element layer 132, GaSb may be used. The use of a light-receiving layer having a multi-quantum-well structure including a pair of an InAs layer and a GaSb layer can provide the semiconductor stacked body 10 that can be used for the production of a light-receiving device appropriate for the detection of infrared light having a wavelength of 4 μm to 12 μm.

To make compensation for the strain of the quantum-well light-receiving layer 13, the unit structure of the quantum-well light-receiving layer 13 may include a strain compensation layer in addition to the first element layer 131 and the second element layer 132. Although the quantum-well light-receiving layer 13 is a multi-quantum-well structure in this embodiment, a single-quantum-well structure may be used instead thereof.

As illustrated in FIG. 1, the control layer 16 is disposed in contact with the a main surface 13A of the quantum-well light-receiving layer 13 opposite the side of the quantum-well light-receiving layer 13 facing the buffer layer 12. The control layer 16 contains a III-V group compound semiconductor. The control layer 16 has one main surface 16A in contact with the quantum-well light-receiving layer 13 and the other main surface 16B in contact with the diffusion blocking layer 14. The control layer 16 is, for example, an $In_sGa_{1-s}As_tSb_{1-t}$ layer (where s is 0 or more and 1 or less, and t is 0 or more and 1 or less). Specifically, the control layer 16 is, for example, an InGaAsSb layer.

The concentration of Sb, which is an element identical to the group V element contained in the quantum-well light-receiving layer 13, in the control layer 16 is lower on the main surface 16B of the control layer 16 adjacent to the diffusion blocking layer 14 than on the main surface 16A of the control layer 16 adjacent to the quantum-well light-receiving layer 13. In FIG. 1, the concentration of Sb contained in the control layer 16 is expressed by dots. In the control layer 16, denser dots indicate higher Sb concentration. In the control layer 16, the concentration of Sb that is an element identical to the group V element contained in the quantum-well light-receiving layer 13 decreases with decreasing distance from the main surface 16A of the control layer 16 adjacent to the quantum-well light-receiving layer 13 toward the main surface 16B of the control layer 16 adjacent to the diffusion blocking layer 14. Specifically, in the control layer 16, the concentration of Sb that is an element identical to the group V element contained in the quantum-well light-receiving layer 13 decreases monotonically with decreasing distance from the main surface 16A of the control layer 16 adjacent to the quantum-well light-receiving layer 13 toward the main surface 16B of the control layer 16 adjacent to the diffusion blocking layer 14. The control layer 16 has a thickness of, for example, 2 nm or more.

The control layer 16 is in contact with the undoped GaAsSb layer serving as the second element layer 132 included in the quantum-well light-receiving layer 13. The concentration of Sb, which is an element identical to the group V element contained in the quantum-well light-receiving layer 13 (second element layer 132), contained in the control layer 16 is, for example, $2 \times 10^{21}$ cm$^{-3}$ or more and $2 \times 10^{22}$ cm$^3$ or less on the main surface 16A of the control layer 16 adjacent to the quantum-well light-receiving layer 13. The concentration of Sb, which is an element identical to the group V element contained in the quantum-well light-receiving layer 13 (second element layer 132), contained in the control layer 16 is, for example, $1 \times 10^{17}$ cm$^3$ or more and $1 \times 10^{21}$ cm$^{-3}$ or less on the main surface 16B of the control layer 16 adjacent to the diffusion blocking layer 14.

The diffusion blocking layer 14 is disposed in contact with the main surface 16B of the control layer 16 opposite the side of the control layer 16 facing the quantum-well light-receiving layer 13. The diffusion blocking layer 14 contains a III-V group compound semiconductor. The diffusion blocking layer 14 has one main surface 14A in contact with the control layer 16 and the other main surface 14B in contact with the contact layer 15.

As the III-V group compound semiconductor contained in the diffusion blocking layer 14, a III-V group compound semiconductor identical to that of the first element layer 131 or the second element layer 132 included in the quantum-well light-receiving layer 13 may be used. The diffusion blocking layer 14 has a p-type impurity concentration of $1 \times 10^{16}$ cm$^{-3}$ or less. The diffusion blocking layer 14 is, for example, an undoped InGaAs layer. The diffusion blocking layer has a thickness of, for example, 500 nm or more.

The contact layer 15 is disposed in contact with the main surface 14B of the diffusion blocking layer 14 opposite the side of the diffusion blocking layer 14 facing the control layer 16. The contact layer 15 has one main surface 15A in contact with the diffusion blocking layer 14. The contact layer 15 contains a III-V group compound semiconductor having p-type conductivity.

As the III-V group compound semiconductor contained in the contact layer 15, for example, InP, InAs, GaSb, GaAs, or InGaAs may be used. Specifically, for example, InP having p-type conductivity (p-InP) is used as a compound semiconductor contained in the contact layer 15. As a p-type impurity contained in the contact layer 15, for example, Zn, Be, Mg, or C may be used.

In the semiconductor stacked body 10 according to the embodiment, the control layer 16 is disposed in contact with the quantum-well light-receiving layer 13 and between the quantum-well light-receiving layer 13 and the diffusion blocking layer 14, and the concentration of Sb, which is an element identical to the group V element contained in the quantum-well light-receiving layer 13, in the control layer 16 is lower on the main surface 16B of the control layer 16 adjacent to the diffusion blocking layer 14 than on the main surface 16A of the control layer 16 adjacent to the quantum-well light-receiving layer 13. The presence of the control layer 16 reduces a sharp change in conduction band level between the diffusion blocking layer 14 and the quantum-well light-receiving layer 13 to reduce the accumulation of the carriers. The difference in conduction band level between the main surface 16B of the control layer 16 and the main surface 14A of the diffusion blocking layer 14 is, for example, 0.1 eV or less, preferably 0.05 eV or less. This reduces a phenomenon in which the extension of a depletion layer is inhibited by the accumulation of the carriers, thus improving the sensitivity of a light-receiving device. The use of the structure eliminates the need for the accurate control of the amount and distribution of the p-type impurity that is incorporated to compensate for the electrons which are the carriers accumulated. The semiconductor stacked body 10 according to an embodiment of the present disclosure can be easily produced and can improve the sensitivity of a light-receiving device including a semiconductor layer containing a III-V group compound semiconductor.

The contact layer 15 preferably has a p-type impurity concentration of $1 \times 10^{18}$ cm$^{-3}$ or more and $1 \times 10^{20}$ cm$^{-3}$ or less. At an impurity concentration of $1 \times 10^{18}$ cm$^{-3}$ or more, an ohmic contact is easily formed when an electrode is formed so as to be in contact with the contact layer 15. At an impurity concentration of $1 \times 10^{20}$ cm$^3$ or less, the diffusion of the impurity from the contact layer 15 to the diffusion blocking layer 14 is inhibited to facilitate the setting of the impurity concentration in the diffusion blocking layer 14 to an appropriate range.

The quantum-well light-receiving layer 13 may contain $1 \times 10^{14}$ cm$^{-3}$ or more and $1 \times 10^{17}$ cm$^{-3}$ or less of a p-type impurity or an n-type impurity. In the case where carriers having one of p- and n-type conductivities are generated in the quantum-well light-receiving layer 13, the incorporation of an impurity that generates carriers having the remaining one of the p- and n-type conductivities into the quantum-well light-receiving layer 13 enables a reduction in carrier concentration in the quantum-well light-receiving layer 13 to achieve high sensitivity. The quantum-well light-receiving layer 13 may contain $1 \times 10^{14}$ cm$^{-3}$ or more and $1 \times 10^{16}$ cm$^{-3}$ or less of the p-type impurity or n-type impurity.

In the semiconductor stacked body 10, each of the oxygen concentration, the carbon concentration, and the hydrogen concentration is preferably $1 \times 10^{17}$ cm$^{-3}$ or less at each of the interfaces between the buffer layer 12 and the quantum-well light-receiving layer 13, between the quantum-well light-receiving layer 13 and the control layer 16, between the control layer 16 and the diffusion blocking layer 14, and between the diffusion blocking layer 14 and the contact layer 15. This results in a reduction in the dark current of a light-receiving element produced from the semiconductor stacked body 10.

In the semiconductor stacked body 10, the buffer layer 12, the quantum-well light-receiving layer 13, the control layer 16, the diffusion blocking layer 14, and the contact layer 15 are preferably stacked without forming a regrown interface. This results in a reduction in the dark current of a light-receiving element produced from the semiconductor stacked body 10.

Figure 2:
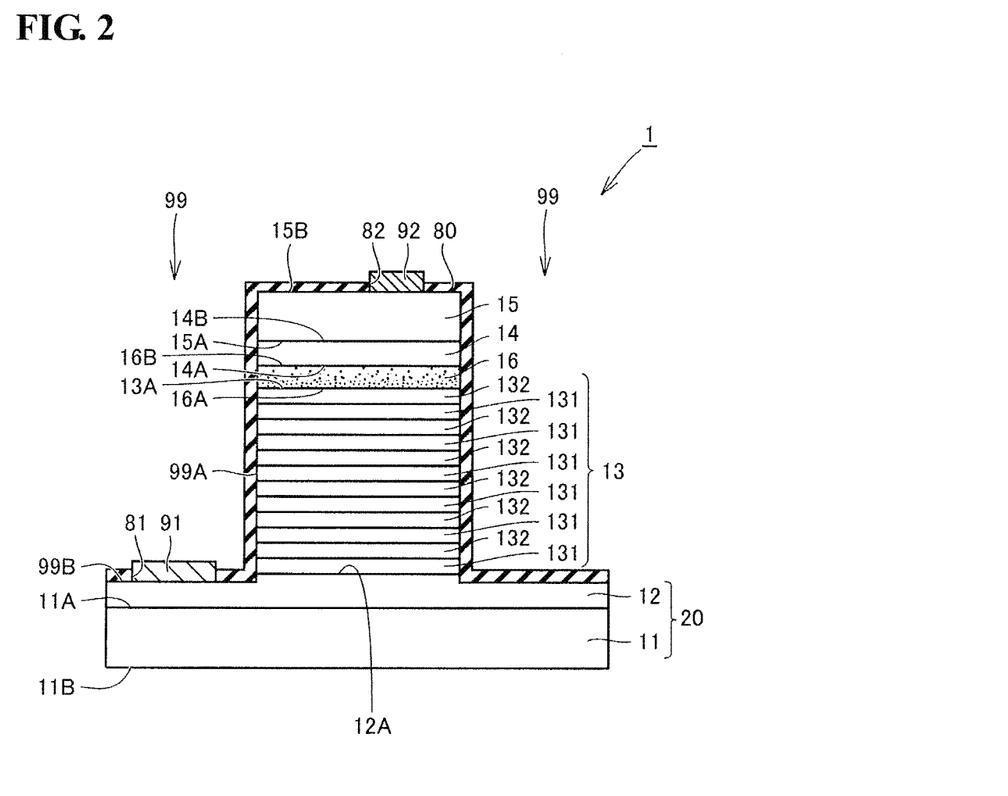
FIG. 2 is a schematic cross-sectional view illustrating the structure of a light-receiving device according to the first embodiment.

An infrared light-receiving device 1 (photodiode) that is an example of light-receiving devices produced from the semiconductor stacked body 10 will be described below. As illustrated in FIG. 2, the infrared light-receiving device 1 according to the embodiment is produced from the semiconductor stacked body 10 according to the embodiment and includes the substrate 11, the buffer layer 12, the quantum-well light-receiving layer 13, the control layer 16, the diffusion blocking layer 14, and the contact layer 15 stacked similarly to the semiconductor stacked body 10. The infrared light-receiving device 1 includes trenches 99 each extending to the buffer layer 12 through the contact layer 15, the diffusion blocking layer 14, the control layer 16, and the quantum-well light-receiving layer 13.

That is, the contact layer 15, the diffusion blocking layer 14, the control layer 16, and the quantum-well light-receiving layer 13 are exposed at side walls 99A of the trenches 99. Bottoms 99B of the trenches 99 are located in the buffer layer 12. In other words, the buffer layer 12 is exposed at the bottoms 99B of the trenches 99.

The infrared light-receiving device 1 further includes a passivation film 80, an n-electrode 91, and a p-electrode 92. The passivation film 80 covers the bottoms 99B of the trenches 99, the side walls 99A of the trenches 99, and a main surface 15B of the contact layer 15 opposite the side of the contact layer 15 facing the diffusion blocking layer 14. The passivation film 80 contains an insulating material such as silicon nitride or silicon oxide.

An opening portion 81 is provided in the passivation film 80 covering the bottoms 99B of the trenches 99 and extends through the passivation film 80 in the thickness direction. The opening portion 81 is filled with the n-electrode 91. The n-electrode 91 is in contact with the buffer layer 12 exposed at the opening portion 81. The n-electrode 91 is composed of a conductive material such as a metal. Specifically, the n-electrode 91 may be composed of, for example, Ti (titanium)/Pt (platinum)/Au (gold). The n-electrode 91 forms an ohmic contact with the buffer layer 12.

An opening portion 82 is provided in the passivation film 80 covering the main surface 15B of the contact layer 15 and extends through the passivation film 80 in the thickness direction. The opening portion 82 is filled with the p-electrode 92. The p-electrode 92 is in contact with a portion of the contact layer 15 exposed at the opening portion 82. The p-electrode 92 is composed of a conductive material such as a metal. Specifically, the p-electrode 92 may be composed of, for example, Ti/Pt/Au. The p-electrode 92 forms an ohmic contact with the contact layer 15.

When infrared light is incident on the infrared light-receiving device 1, the infrared light is absorbed between quantum levels in the quantum-well light-receiving layer 13 to generate electron-hole pairs. The generated electrons and holes are taken from the infrared light-receiving device 1 as photocurrent signals, thereby detecting infrared light.

The p-electrode 92 is a pixel electrode. The infrared light-receiving device 1 may include only a single p-electrode 92 as illustrated in FIG. 2 or may include multiple pixel electrodes (p-electrodes 92). Specifically, the infrared light-receiving device 1 may have a structure in which a structure illustrated in FIG. 2 is used as a unit structure and the unit structure is repeated multiple times in the direction in which the first main surface 11A of the substrate 11 extends in FIG. 2. In this case, the infrared light-receiving device 1 includes the multiple p-electrodes 92 corresponding to the number of pixels, whereas only a single n-electrode 91 is disposed. This structure will be described in a third embodiment below.

The infrared light-receiving device 1 of the embodiment includes the semiconductor stacked body 10 of the embodiment. Thus, the infrared light-receiving device 1 is easily produced and has good sensitivity.

The outline of a method for producing the semiconductor stacked body 10 and the infrared light-receiving device 1 according to the embodiment will be described below with reference to FIGS. 1 to 9.

Figure 3:
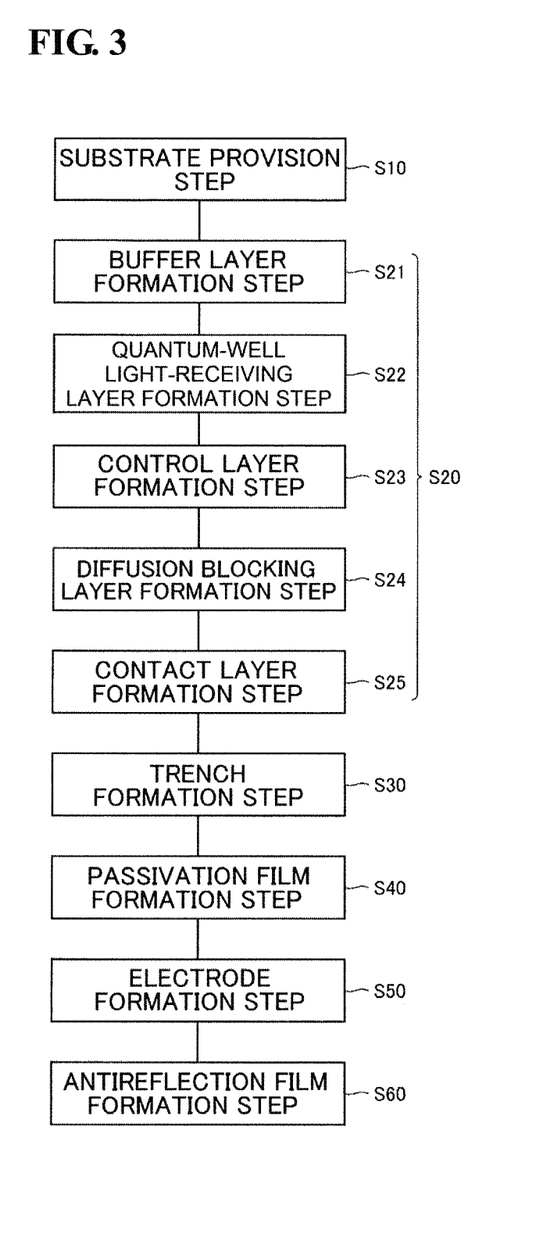
FIG. 3 is a flow chart illustrating the outline of a method for producing a semiconductor stacked body and a light-receiving device according to the first embodiment.
Figure 4:
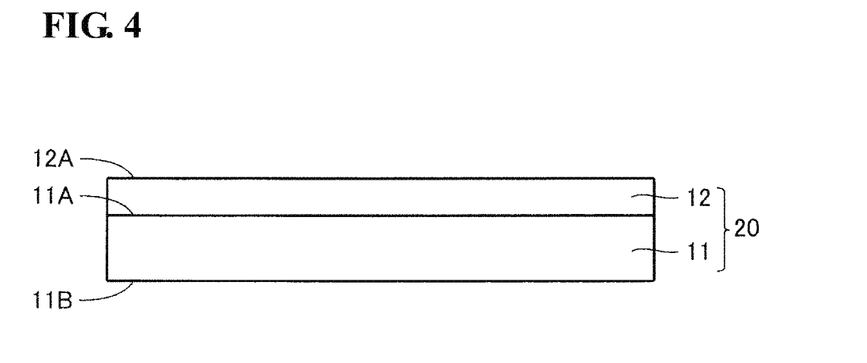
FIG. 4 is a schematic cross-sectional view illustrating the method for producing a semiconductor stacked body and a light-receiving device according to the first embodiment.

As illustrated in FIG. 3, in the method for producing the semiconductor stacked body 10 and the infrared light-receiving device 1 according to the embodiment, a substrate provision step is first performed as step S10. As illustrated in FIG. 4, for example, the substrate 11 having a diameter of 2 inches (50.8 mm) and containing InP is provided in step S10. Specifically, an ingot containing InP is sliced to provide the substrate 11 containing InP. The substrate 11 is subjected to surface polishing and then a process such as washing, thereby providing the substrate 11 having the main surface 11A with good flatness and good cleanliness.

Subsequently, an operation layer formation step is performed as step S20. In step S20, the buffer layer 12, the quantum-well light-receiving layer 13, the control layer 16, the diffusion blocking layer 14, and the contact layer 15, which are operation layers, are formed on the main surface 11A of the substrate 11 provided in step S10. The formation of the operation layers can be performed by, for example, metal-organic vapor phase epitaxy. The formation of the operation layers by the metal-organic vapor phase epitaxy can be performed by, for example, placing the substrate 11 on a rotary table equipped with a heater for heating the substrate and supplying source gases onto the substrate while the substrate 11 is heated by the heater.

Step S20 includes buffer layer formation step S21, quantum-well light-receiving layer formation step S22, control layer formation step S23, diffusion blocking layer formation step S24, and a contact layer formation step S25.

Step S21 is first performed in step S20. As illustrated in FIG. 4, the buffer layer 12 containing, for example, n-InGaAs, which is a III-V group compound semiconductor, is formed in step S21 so as to be in contact with the one main surface 11A of the substrate 11 by metal-organic vapor phase epitaxy. In the formation of the buffer layer 12 containing n-InGaAs, examples of an In source material that can be used include trimethylindium (TMIn) and triethylindium (TEIn). Examples of a Ga source material that can be used include triethylgallium (TEGa) and trimethylgallium (TMGa). Examples of an As source material that can be used include tert-butyl arsine (TBAs) and trimethylarsine (TMAs).

Figure 5:
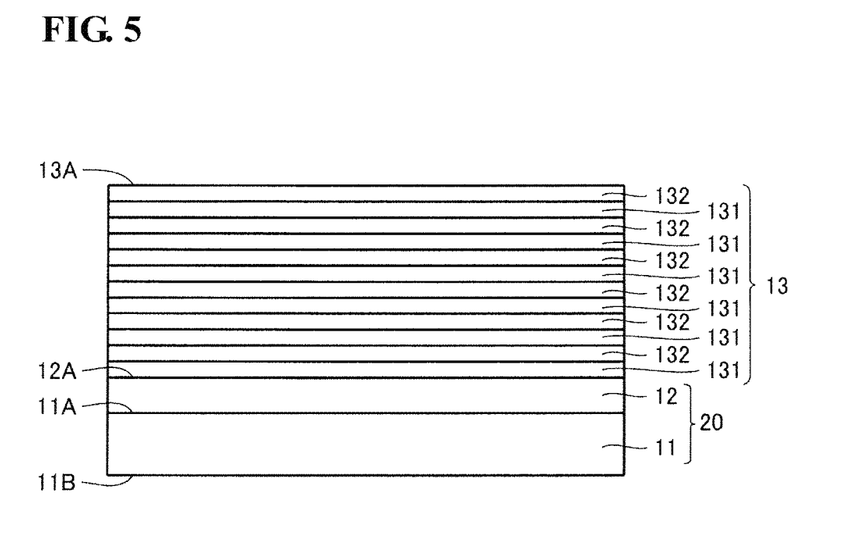
FIG. 5 is a schematic cross-sectional view illustrating the method for producing a semiconductor stacked body and a light-receiving device according to the first embodiment.

Step S22 is then performed. As illustrated in FIGS. 4 and 5, the first element layer 131 containing, for example, $In_xGa_{1-x}As$ (where x is 0.38 or more and 1 or less), which is a III-V group compound semiconductor, and the second element layer 132 containing, for example, $GaAs_{1-y}Sb_y$ (where y is 0.36 or more and 1 or less), which is a III-V group compound semiconductor, are alternately stacked in step S22 so as to be in contact with the first main surface 12A of the buffer layer 12 opposite the side of the buffer layer 12 facing the substrate 11, thereby forming the quantum-well light-receiving layer 13. The formation of the quantum-well light-receiving layer 13 can be performed subsequently to the formation of the buffer layer 12 by the metal-organic vapor phase epitaxy. In other words, the formation of the quantum-well light-receiving layer 13 can be performed by changing the source gas while the substrate 11 is placed in an apparatus used in the formation of the buffer layer 12. The quantum-well light-receiving layer 13 is formed so as to have a thickness of 1 μm or more.

In the formation of the first element layer 131 containing $In_xGa_{1-x}As$ (where x is 0.38 or more and 1 or less), examples of an In source material that can be used include TMIn and TEIn. Examples of a Ga source material that can be used include TEGa and TMGa. Examples of an As source material include TBAs and TMAs. In the formation of the second element layer 132 containing $GaAs_{1-y}Sb_y$ (where y is 0.36 or more and 1 or less), examples of a Ga source material that can be used include TEGa and TMGa. Examples of an As source material include TBAs and TMAs. Examples of an Sb source material that can be used include trimethylantimony (TMSb), triethylantimony (TESb), triisopropylantimony (TIPSb), tris(dimethylamino)antimony (TDMASb), and tri-tert-butyl antimony (TTBSb). Thereby, the quantum-well light-receiving layer 13 with type-II quantum wells can be formed.

Figure 6:
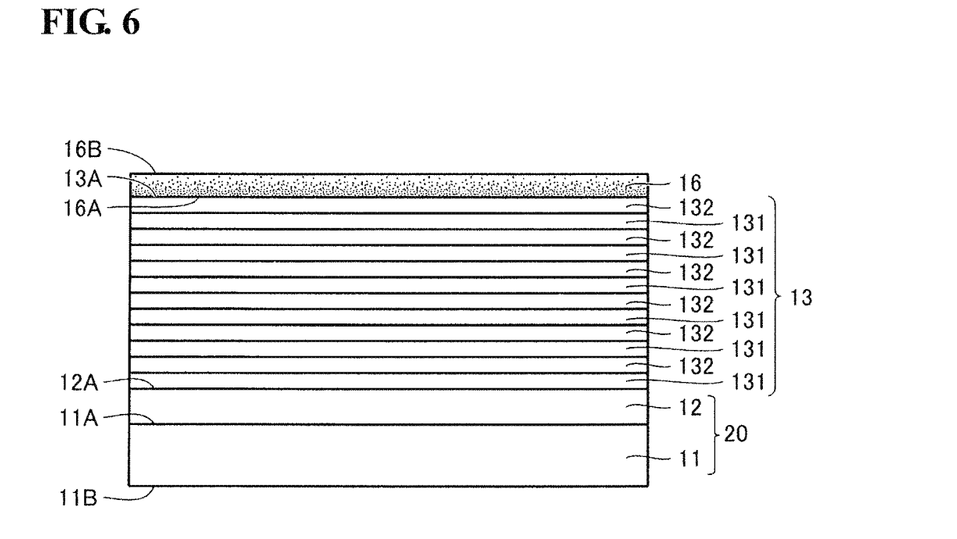
FIG. 6 is a schematic cross-sectional view illustrating the method for producing a semiconductor stacked body and a light-receiving device according to the first embodiment.

Step S23 is then performed. As illustrated in FIGS. 5 and 6, the control layer 16 containing, for example, InGaAsSb, which is a III-V group compound semiconductor, is formed in step S23 so as to be in contact with the main surface 13A of the quantum-well light-receiving layer 13 opposite the side of the quantum-well light-receiving layer 13 facing the buffer layer 12. The formation of the control layer 16 can be performed subsequently to the formation of the quantum-well light-receiving layer 13 by the metal-organic vapor phase epitaxy. The formation of the control layer 16 can be performed by adding the introduction of an Sb source gas to the same procedure as the buffer layer 12. The gradual decrease in the flow rate of the Sb source material with time enables the formation of the control layer 16 in which the concentration of Sb decreases monotonically with decreasing distance from the main surface 16A of the control layer 16 adjacent to the quantum-well light-receiving layer 13 toward the main surface 16B of the control layer 16 adjacent to the diffusion blocking layer 14.

Figure 7:
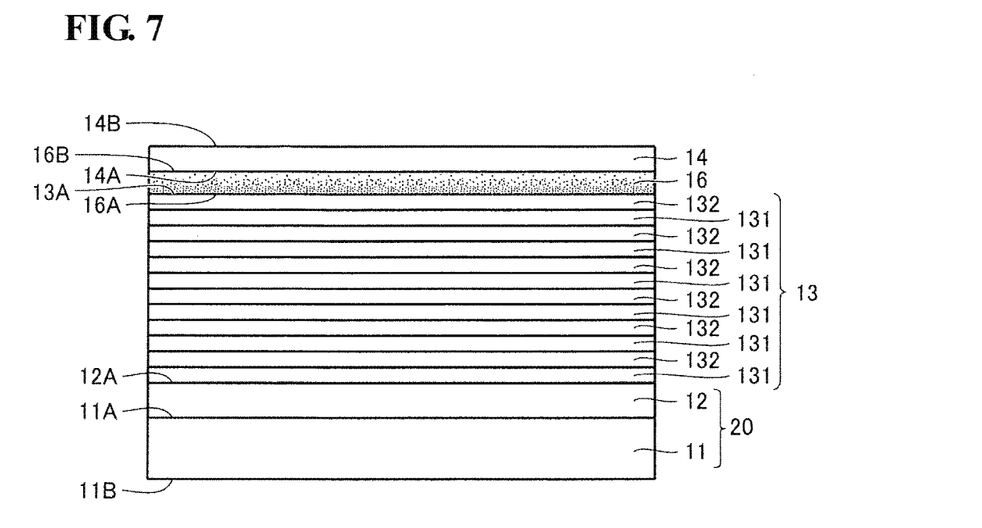
FIG. 7 is a schematic cross-sectional view illustrating the method for producing a semiconductor stacked body and a light-receiving device according to the first embodiment.

Step S24 is then performed. As illustrated in FIGS. 6 and 7, the diffusion blocking layer 14 containing, for example, InGaAs, which is a III-V group compound semiconductor, is formed in step S24 so as to be in contact with the main surface 16B of the control layer 16 opposite the side of the control layer 16 facing the quantum-well light-receiving layer 13. The formation of the diffusion blocking layer 14 can be performed subsequently to the formation of the control layer 16 by the metal-organic vapor phase epitaxy. The formation of the diffusion blocking layer 14 can be performed by omitting the introduction of a source gas for the addition of an n-type impurity in the same procedure as the buffer layer 12. In other words, the diffusion blocking layer 14 can be a semiconductor layer composed of undoped InGaAs.

Step S25 is then performed. As illustrated in FIGS. 7 and 1, the contact layer 15 containing, for example, p-InP, which is a III-V group compound semiconductor having p-type conductivity, is formed in step S25 so as to be in contact with the main surface 14B of the diffusion blocking layer 14 opposite the side of the diffusion blocking layer 14 facing the control layer 16. The formation of the contact layer 15 can be performed subsequently to the formation of the diffusion blocking layer 14 by the metal-organic vapor phase epitaxy. An example of a P source material that can be used is tert-butylphosphine (TBP).

The semiconductor stacked body 10 including the control layer 16 according to the embodiment is completed by performing steps S10 and S20. The implementation of step S20 by the metal-organic vapor phase epitaxy can improve the production efficiency of the semiconductor stacked body 10. Step S20 is not limited to a step performed by the metal-organic vapor phase epitaxy using only metal-organic source materials (all-metal-organic-source vapor phase epitaxy). For example, step S20 may be performed by, for example, metal-organic vapor phase epitaxy with hydrides such as $AsH_3$ (arsine) serving as an As source material and $SiH_4$ (silane) serving as a Si source material. However, the use of the all-metal-organic-source vapor phase epitaxy can result in the semiconductor stacked body 10 containing high-quality crystals.

The semiconductor stacked body 10 can also be produced by a method other than the metal-organic vapor phase epitaxy. For example, molecular beam epitaxy (MBE) may be employed.

Preferably, step S20 is continuously performed by changing the source gases while the substrate 11 is placed in the apparatus, as described above. That is, step S20 is preferably performed in such a manner that the buffer layer 12, the quantum-well light-receiving layer 13, the control layer 16, the diffusion blocking layer 14, and the contact layer 15 are stacked without forming a regrown interface. This can reduce the dark current.

Figure 8:
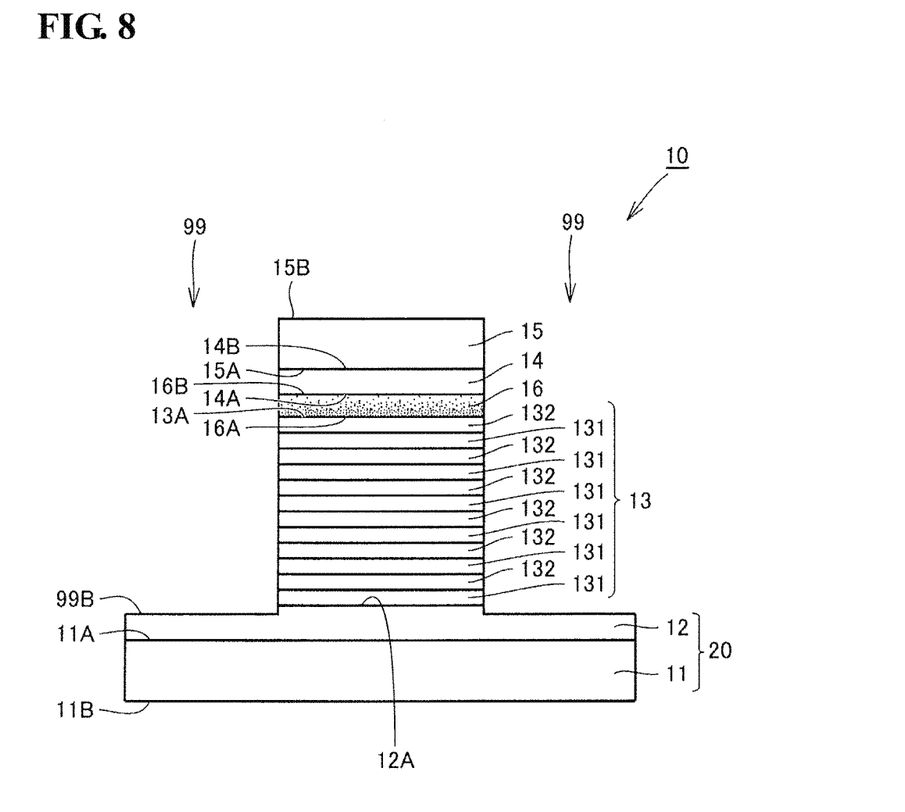
FIG. 8 is a schematic cross-sectional view illustrating the method for producing a semiconductor stacked body and a light-receiving device according to the first embodiment.

As illustrated in FIG. 3, trench formation step S30 is then performed. As illustrated in FIGS. 1 and 8, the trenches 99 are formed in step S30 in the semiconductor stacked body 10 that has been produced through steps S10 and S20, each of the trenches 99 extending to the buffer layer 12 through the contact layer 15, the diffusion blocking layer 14, the control layer 16, and the quantum-well light-receiving layer 13. The trenches 99 can be formed by, for example, forming a mask layer on the main surface 15B of the contact layer 15, the mask layer having openings having a shape corresponding to that of the trenches 99, and then performing etching.

Figure 9:
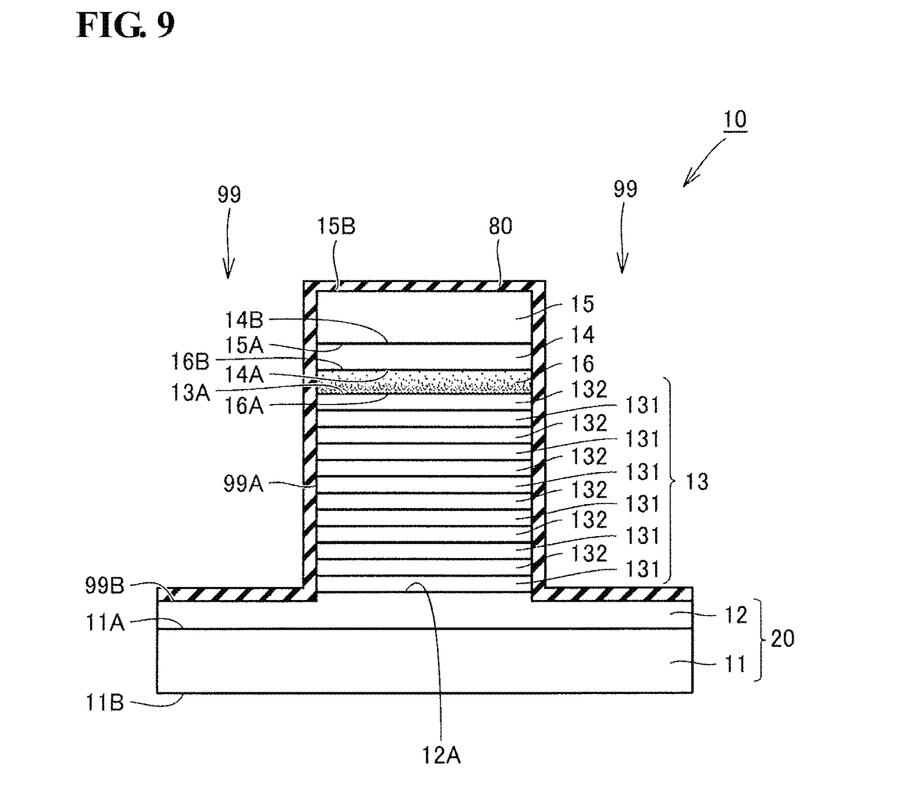
FIG. 9 is a schematic cross-sectional view illustrating the method for producing a semiconductor stacked body and a light-receiving device according to the first embodiment.

Passivation film formation step S40 is then performed. As illustrated in FIGS. 8 and 9, the passivation film 80 is formed in step S40 on the semiconductor stacked body 10 including the trenches 99 that have been formed in step S30. Specifically, the passivation film 80 containing an insulating material such as silicon oxide or silicon nitride is formed by, for example, chemical vapor deposition (CVD). The passivation film 80 is formed so as to cover the bottoms 99B of the trenches 99, the side walls 99A of the trenches 99, and the main surface 15B of the contact layer 15 opposite the side of the contact layer 15 facing the diffusion blocking layer 14.

Electrode formation step S50 is then performed. As illustrated in FIGS. 9 and 2, the n-electrode 91 and the p-electrode 92 are formed in step S50 on the semiconductor stacked body 10 on which the passivation film 80 has been formed in step S40. Specifically, for example, a mask having openings at positions corresponding to regions where the n-electrode 91 and the p-electrode 92 are to be formed is formed on the passivation film 80. The opening portions 81 and 82 are formed in the passivation film 80 with the mask. Then the n-electrode 91 and the p-electrode 92 composed of an appropriate conductive material are formed by, for example, a vapor deposition method. The infrared light-receiving devices 1 according to the embodiment are completed through the foregoing steps. The infrared light-receiving devices 1 are divided into individual devices by, for example, dicing.

Second Embodiment

Figure 10:
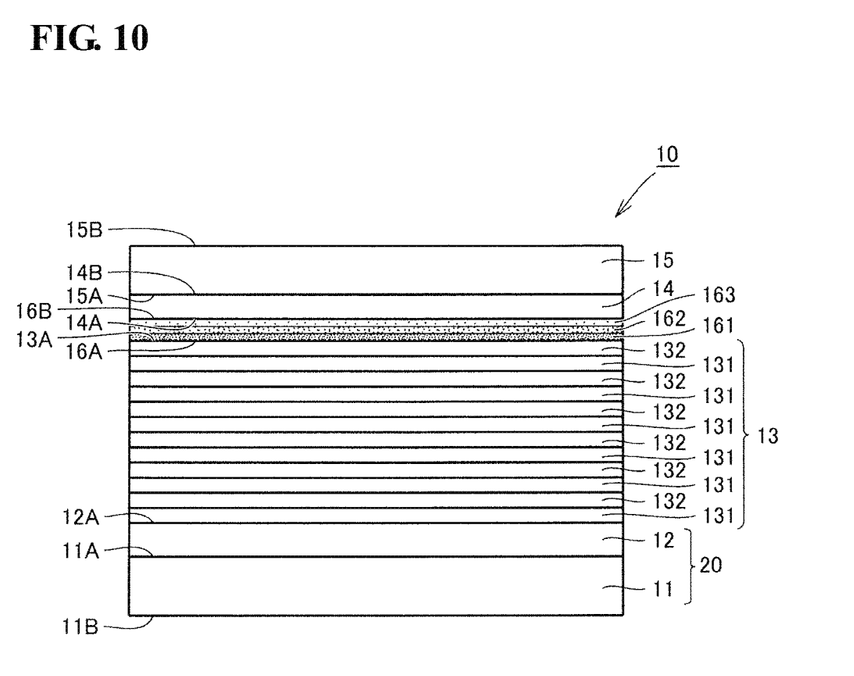
FIG. 10 is a schematic cross-sectional view illustrating the structure of a semiconductor stacked body according to a second embodiment.
Figure 11:
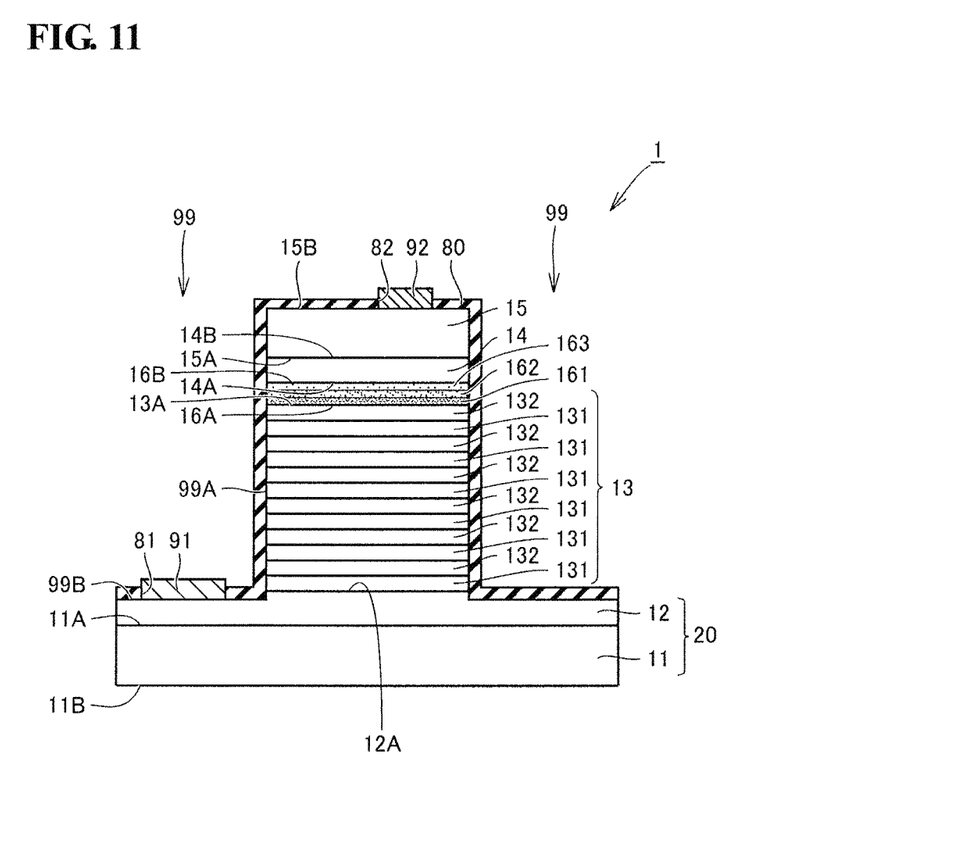
FIG. 11 is a schematic cross-sectional view illustrating the structure of a light-receiving device according to the second embodiment.

A semiconductor stacked body and a light-receiving device, which are of another embodiment of the semiconductor stacked body and the light-receiving device according to the present disclosure, according to a second embodiment will be described below. FIG. 10 is a schematic cross-sectional view illustrating the structure of a semiconductor stacked body according to the second embodiment and corresponds to FIG. 1 in the first embodiment. FIG. 11 is a schematic cross-sectional view illustrating the structure of a light-receiving device according to the second embodiment and corresponds to FIG. 2 in the first embodiment.

As illustrated in FIGS. 10, 11, 1, and 2, the semiconductor stacked body 10 and the infrared light-receiving device 1 according to the second embodiment basically have the same structure as in the first embodiment and provide the same effects. The semiconductor stacked body 10 and the infrared light-receiving device 1 according to the second embodiment, however, differ from those according to the first embodiment in terms of the structure of the control layer 16.

As illustrated in FIGS. 10 and 11, the control layer 16 of each of the semiconductor stacked body 10 and the infrared light-receiving device 1 according to the second embodiment includes a first control layer 161, a second control layer 162, and a third control layer 163. The first control layer 161, the second control layer 162, and the third control layer 163 are stacked in this order, the first control layer 161 being in contact with the quantum-well light-receiving layer 13, the third control layer 163 being in contact with the diffusion blocking layer 14. The concentration of Sb that is an element identical to the group V element contained in the quantum-well light-receiving layer 13 is highest in the first control layer 161 and lowest in the third control layer 163. The concentration of Sb in the second control layer 162 is lower than that in the first control layer 161 and higher than that in the third control layer 163. Each of the first control layer 161, the second control layer 162, and the third control layer 163 has a constant Sb concentration. In other words, regarding the control layer 16 according to the second embodiment, the concentration of Sb that is an element identical to the group V element contained in the quantum-well light-receiving layer 13 decreases stepwise with decreasing distance from the main surface 16A of the control layer 16 adjacent to the quantum-well light-receiving layer 13 toward the main surface 16B of the control layer 16 adjacent to the diffusion blocking layer 14. The semiconductor stacked body 10 and the infrared light-receiving device 1 including the control layer 16 can be easily produced by a stepwise (three-step) decrease in the flow rate of the Sb source gas in step S23 according to the first embodiment. Even when the control layer 16 having the structure is used, the same effects as in the first embodiment are provided.

Third Embodiment

Figure 12:
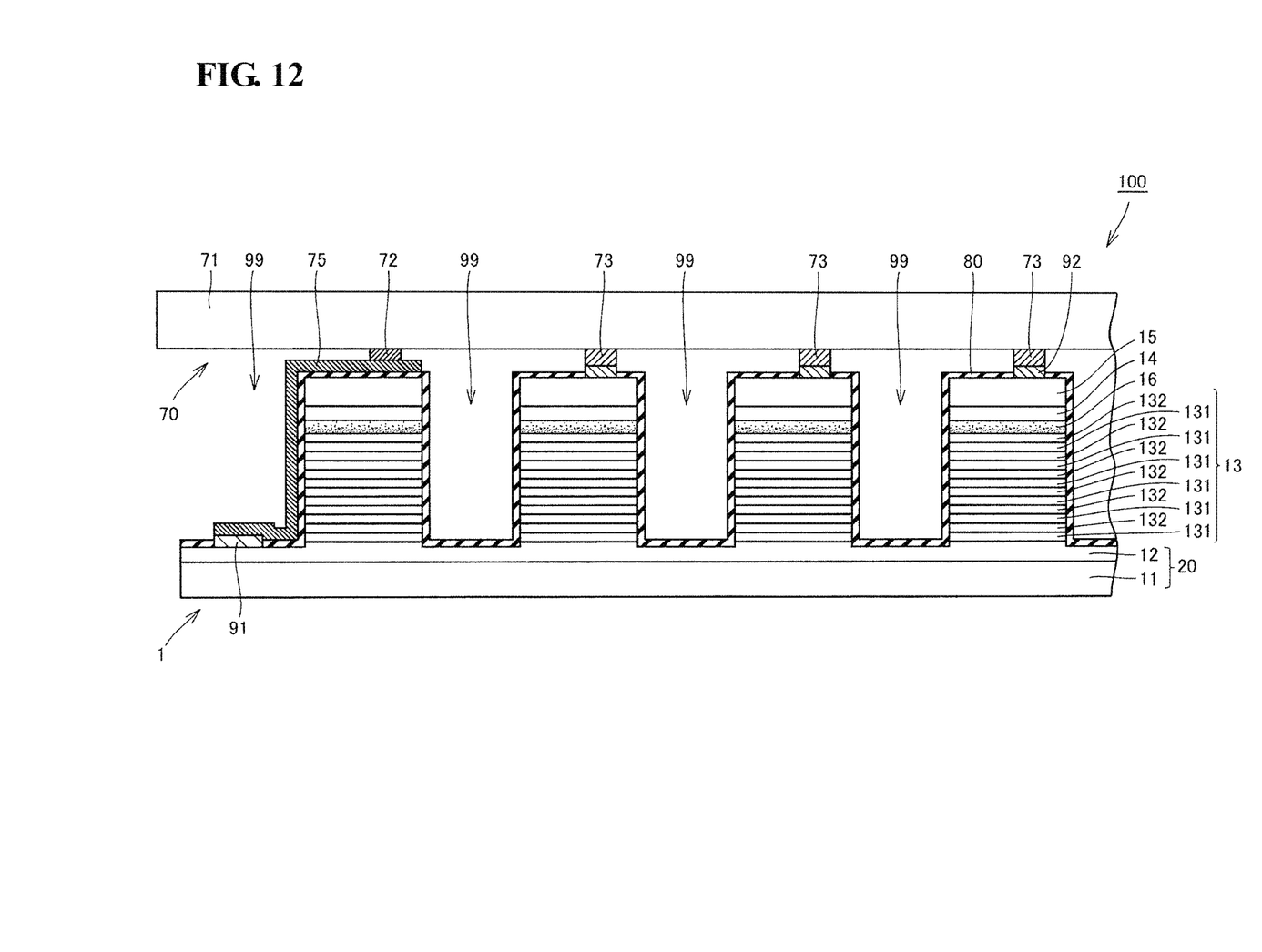
FIG. 12 is a schematic cross-sectional view illustrating the structure of a light-receiving device and a sensor according to a third embodiment.

A light-receiving device and a sensor, which are of another embodiment of the light-receiving device according to the present disclosure, according to a third embodiment will be described below. As illustrated in FIGS. 12 and 2, the infrared light-receiving device 1 according to the third embodiment has a structure in which a structure illustrated in FIG. 2 is used as a unit structure and the unit structure is repeated multiple times in the direction in which the first main surface 11A of the substrate 11 extends. The infrared light-receiving device 1 includes the multiple p-electrodes 92 corresponding to the number of pixels, whereas only a single n-electrode 91 is disposed.

Specifically, as illustrated in FIG. 12, the n-electrode 91 of the infrared light-receiving device 1 according to the third embodiment is disposed on the bottom of the trench 99 located at an end portion of the substrate 11 in a direction in which the substrate 11 extends. The p-electrode 92 on the contact layer 15 adjacent to the trench 99 located at the end portion is omitted. An infrared sensor 100 according to the embodiment includes the infrared light-receiving device 1 having the structure and a read-out integrated circuit (ROIC) 70 electrically connected to the infrared light-receiving device 1. The read-out integrated circuit 70 is, for example, a complementary metal oxide semiconductor (CMOS) circuit.

Multiple read-out electrodes (not illustrated) arranged on a main body 71 of the read-out integrated circuit 70 are electrically connected to the respective p-electrodes 92 functioning as pixel electrodes in the infrared light-receiving device 1 through bumps 73. The infrared light-receiving device 1 also includes a lead wire 75 that is in contact with the n-electrode 91, that extends along the bottom and the side wall of the trench 99 at which the n-electrode 91 is located, and that extends to the top of the contact layer 15. The lead wire 75 is electrically connected to a ground electrode (not illustrated) disposed on the main body 71 of the read-out integrated circuit 70 through a bump 72. In this structure, light reception information for each pixel of the infrared light-receiving device 1 is output from a corresponding one of the p-electrode 92 (pixel electrodes) to a corresponding one of the read-out electrodes of the read-out integrated circuit 70. The light reception information sets are collected by the read-out integrated circuit 70 to provide, for example, a two-dimensional image.

While the infrared light-receiving device 1 including the structure illustrated in FIG. 2 as a unit structure has been described in this embodiment, the infrared light-receiving device 1 may include the structure illustrated in FIG. 11 as a unit structure.

EXAMPLES

To examine the effects of the semiconductor stacked body and the light-receiving device according to embodiments of the present disclosure, samples of the infrared light-receiving device 1 of an example were produced in the same procedure as in the first embodiment and examined for the depletion layer width and sensitivity. For comparison, samples of a comparative example were produced in which the formation of the control layer 16 was omitted and Zn, serving as a p-type impurity, was incorporated in the diffusion blocking layer 14 in order to compensate for carriers (electrons) accumulated at and/or near the interface between the quantum-well light-receiving layer 13 and the diffusion blocking layer 14. The samples were similarly examined for the depletion layer width and sensitivity.

The results revealed the following: Although the samples according to the comparative examples basically had a sufficient depletion layer width and sufficient sensitivity, the samples had large variations in depletion layer width and sensitivity; thus, some of the samples had an insufficient depletion layer width and insufficient sensitivity. In contrast, the samples according to the example stably had a sufficient depletion layer width and sufficient sensitivity. The percentage of the samples having an insufficient depletion layer width and insufficient sensitivity was clearly lower than that of the samples according to the comparative example.

This demonstrated that according to the semiconductor stacked body and the light-receiving device of the present disclosure, it is possible to provide the semiconductor stacked body that can be easily produced and that can improve the sensitivity of the light-receiving device including the semiconductor layer containing the III-V group compound semiconductor.

The embodiments and the examples disclosed herein are to be considered in all respects as illustrative and not limiting. The scope of the invention is defined not by the foregoing description but by the following claims, and is intended to include any modifications within the scope and meaning equivalent to the scope of the claims.

What is claimed is:

1. A semiconductor stacked body, comprising:
   a base layer containing a III-V group compound semiconductor and having n-type conductivity;
   a light-receiving layer containing a III-V group compound semiconductor;
   a control layer containing a III-V group compound semiconductor and disposed in contact with the light-receiving layer;
   a diffusion blocking layer containing a III-V group compound semiconductor and a p-type impurity that generates a p-type carrier, the diffusion blocking layer having a p-type impurity concentration of $1 \times 10^{16}$ cm$^{-3}$ or less; and
   a contact layer containing a III-V group compound semiconductor and having p-type conductivity,
   the base layer, the light-receiving layer, the control layer, the diffusion blocking layer, and the contact layer being stacked in this order,
   wherein a concentration of an element in the control layer, the element being identical to a group V element contained in the light-receiving layer, is lower on a main surface of the control layer adjacent to the diffusion blocking layer than on a main surface of the control layer adjacent to the light-receiving layer.

2. The semiconductor stacked body according to claim 1, wherein the concentration of the element in the control layer, the element being identical to the group V element contained in the light-receiving layer, decreases with decreasing distance from the main surface of the control layer adjacent to the light-receiving layer toward the main surface of the control layer adjacent to the diffusion blocking layer.

3. The semiconductor stacked body according to claim 2, wherein the concentration of the element in the control layer, the element being identical to the group V element contained in the light-receiving layer, decreases monotonically with decreasing distance from the main surface of the control layer adjacent to the light-receiving layer toward the main surface of the control layer adjacent to the diffusion blocking layer.

4. The semiconductor stacked body according to claim 2, wherein the concentration of the element in the control layer, the element being identical to the group V element contained in the light-receiving layer, decreases stepwise with decreasing distance from the main surface of the control layer adjacent to the light-receiving layer toward the main surface of the control layer adjacent to the diffusion blocking layer.

5. The semiconductor stacked body according to claim 1, wherein the group V element contained in the light-receiving layer is Sb.

6. The semiconductor stacked body according to claim 1, wherein the control layer has a thickness of 2 nm or more.

7. The semiconductor stacked body according to claim 1, wherein the diffusion blocking layer has a thickness of 50 nm or more.

8. The semiconductor stacked body according to claim 1, wherein the light-receiving layer has a multi-quantum-well structure including a pair of an $In_xGa_{1-x}As$ layer (where x is 0.38 or more and 1 or less) and a $GaAs_{1-y}Sb_y$ layer (where y is 0.36 or more and 1 or less), or a pair of a $Ga_{1-u}In_uN_vAs_{1-v}$ layer (where u is 0.4 or more and 0.8 or less, and v is more than 0 and 0.2 or less) and a $GaAs_{1-y}Sb_y$ layer (where y is 0.36 or more and 0.62 or less).

9. The semiconductor stacked body according to claim 8, wherein the base layer includes a substrate containing GaAs, GaP, GaSb, InP, InAs, InSb, AlSb, or AlAs.

10. The semiconductor stacked body according to claim 8, wherein the control layer is an $In_sGa_{1-s}As_tSb_{1-t}$ layer (where s is 0 or more and 1 or less, and t is 0 or more and 1 or less).

11. The semiconductor stacked body according to claim 1, wherein the light-receiving layer has a thickness of 1 µm or more.

12. A light-receiving device, comprising:
    the semiconductor stacked body according to claim 1; and
    an electrode disposed on the semiconductor stacked body.

* * * * *